US010386002B2

(12) United States Patent
Hayes, Jr.

(10) Patent No.: US 10,386,002 B2
(45) Date of Patent: Aug. 20, 2019

(54) NON-TERMINATING DOUBLE CONTAINMENT FITTING

(71) Applicant: Fit-Line, Inc., Santa Ana, CA (US)

(72) Inventor: Frank F. Hayes, Jr., Costa Mesa, CA (US)

(73) Assignee: Fit-Line, Inc., Santa Ana, CA (US)

(*) Notice: Subject to any disclaimer, the term of this patent is extended or adjusted under 35 U.S.C. 154(b) by 907 days.

(21) Appl. No.: 14/932,879

(22) Filed: Nov. 4, 2015

(65) Prior Publication Data

US 2017/0122473 A1    May 4, 2017

(51) Int. Cl.

| F16L 19/06 | (2006.01) |
| F16L 39/00 | (2006.01) |
| F16L 41/02 | (2006.01) |
| F16L 19/07 | (2006.01) |
| F16L 47/04 | (2006.01) |
| F16L 47/32 | (2006.01) |
| H01L 21/00 | (2006.01) |
| H01L 21/67 | (2006.01) |

(52) U.S. Cl.
CPC .......... *F16L 39/005* (2013.01); *F16L 19/061* (2013.01); *F16L 19/062* (2013.01); *F16L 19/07* (2013.01); *F16L 41/021* (2013.01); *F16L 47/04* (2013.01); *F16L 47/32* (2013.01); *F16L 2201/30* (2013.01); *H01L 21/00* (2013.01); *H01L 21/67* (2013.01)

(58) Field of Classification Search
CPC ......... F16L 47/04; F16L 47/265; F16L 47/32; F16L 41/021; F16L 19/062; F16L 19/061; F16L 19/07; F16L 39/005; F16L 37/105

USPC ..... 285/123.1, 123.15, 133.11, 133.21, 13.4, 285/353, 133.4
See application file for complete search history.

(56) References Cited

U.S. PATENT DOCUMENTS

| 5,213,375 A * | 5/1993 | Wu .................... F16L 19/062 |
| 5,332,269 A * | 7/1994 | Homm .................. F16L 47/04 |
| 5,498,036 A | 3/1996 | Kingsford |
| 5,687,993 A | 11/1997 | Brim |
| 6,183,021 B1 | 2/2001 | Walsh et al. |
| 2009/0284004 A1 | 11/2009 | Simmons et al. |
| 2010/0133812 A1 * | 6/2010 | Williams .............. F16L 19/061 |
| 2017/0274507 A1 * | 9/2017 | Leys .................... F16L 47/04 |

OTHER PUBLICATIONS

Data sheet describing terminating double containment fitting, which was marketed by Fit-Line, Inc. prior to Nov. 4, 2014.

* cited by examiner

*Primary Examiner* — Greg Binda
*Assistant Examiner* — Zachary T Dragicevich
(74) *Attorney, Agent, or Firm* — Larry K. Roberts

(57) ABSTRACT

A double containment fitting for connection to a double containment tubing system with an outer, secondary containment tubing surrounding an inner, primary tubing. The fitting includes a fitting body defining a central passageway, the fitting body having a center portion disposed between opposed first and second body ports. The fitting body is configured to receive the tubing system into the first body port. The central passageway has a diameter in the first port selected to allow the secondary tubing into the first body port. A connection system mechanically secures the secondary tubing to the first body port.

15 Claims, 11 Drawing Sheets

NON-TERMINATING DOUBLE CONTAINMENT FITTING

BACKGROUND

Double containment piping or tubing systems are commonly used to transport fluids in various environments. A common application is that of transport of hazardous materials, such as in processes utilizing hazardous materials. One exemplary application is that of semiconductor fabrication processes, utilizing chemicals of a hazardous classification, although there are many other applications using double containment systems. A double containment system utilizes an outer, secondary containment pipe or tubing surrounding an inner, primary pipe or tubing, with an annulus or interstitial space between the inner and outer pipes or tubing. In the event of a leak from the inner tubing, the outer tubing contains the fluid.

Even though the outer tubing of a double containment system contains fluid leaking from a primary inner tubing, the fluid within the interstitial space presents a problem of handling the leaked fluid.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
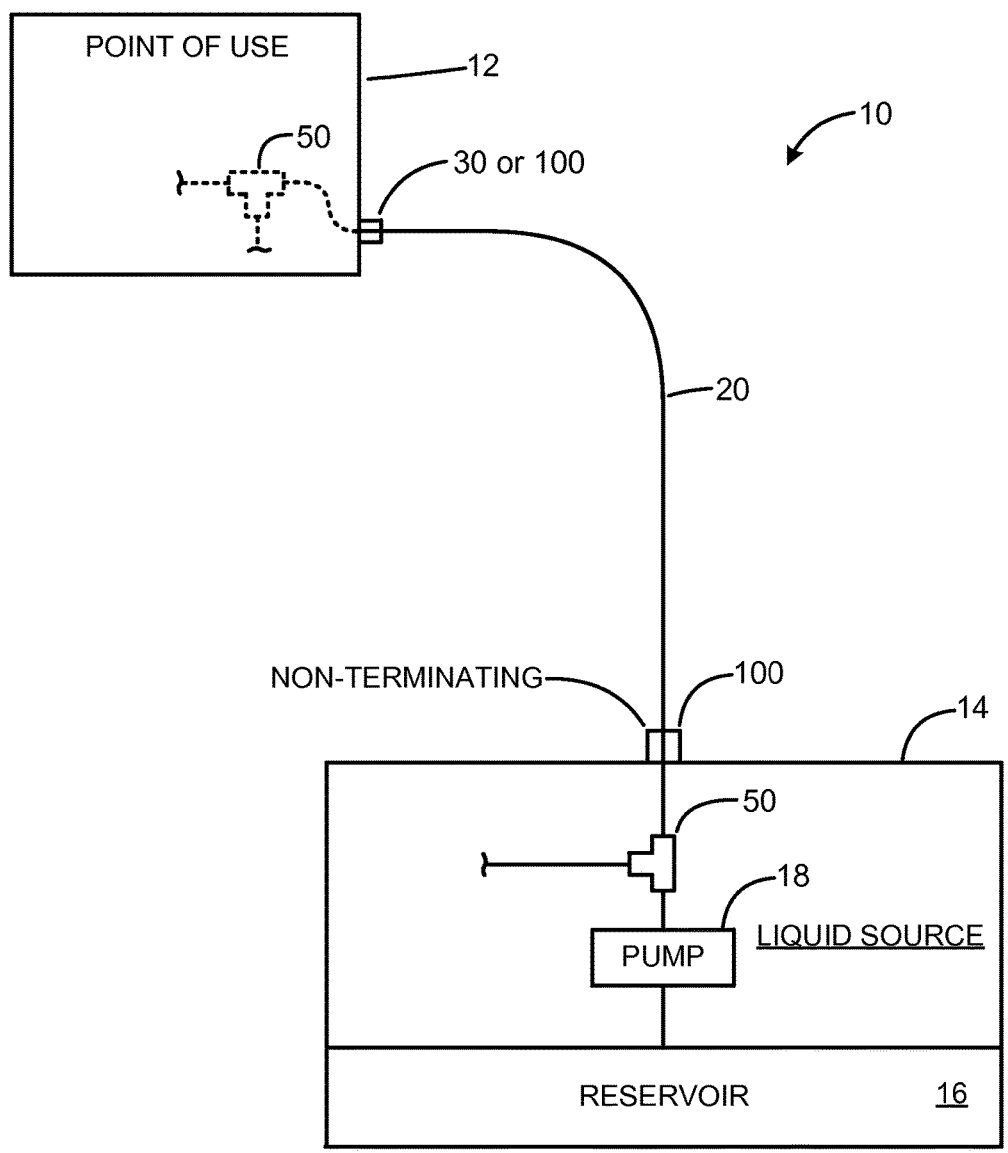
FIG. 1 is a schematic diagram illustrating an exemplary environment in which one or more non-terminating double containment fittings may be used.
Figure 2:
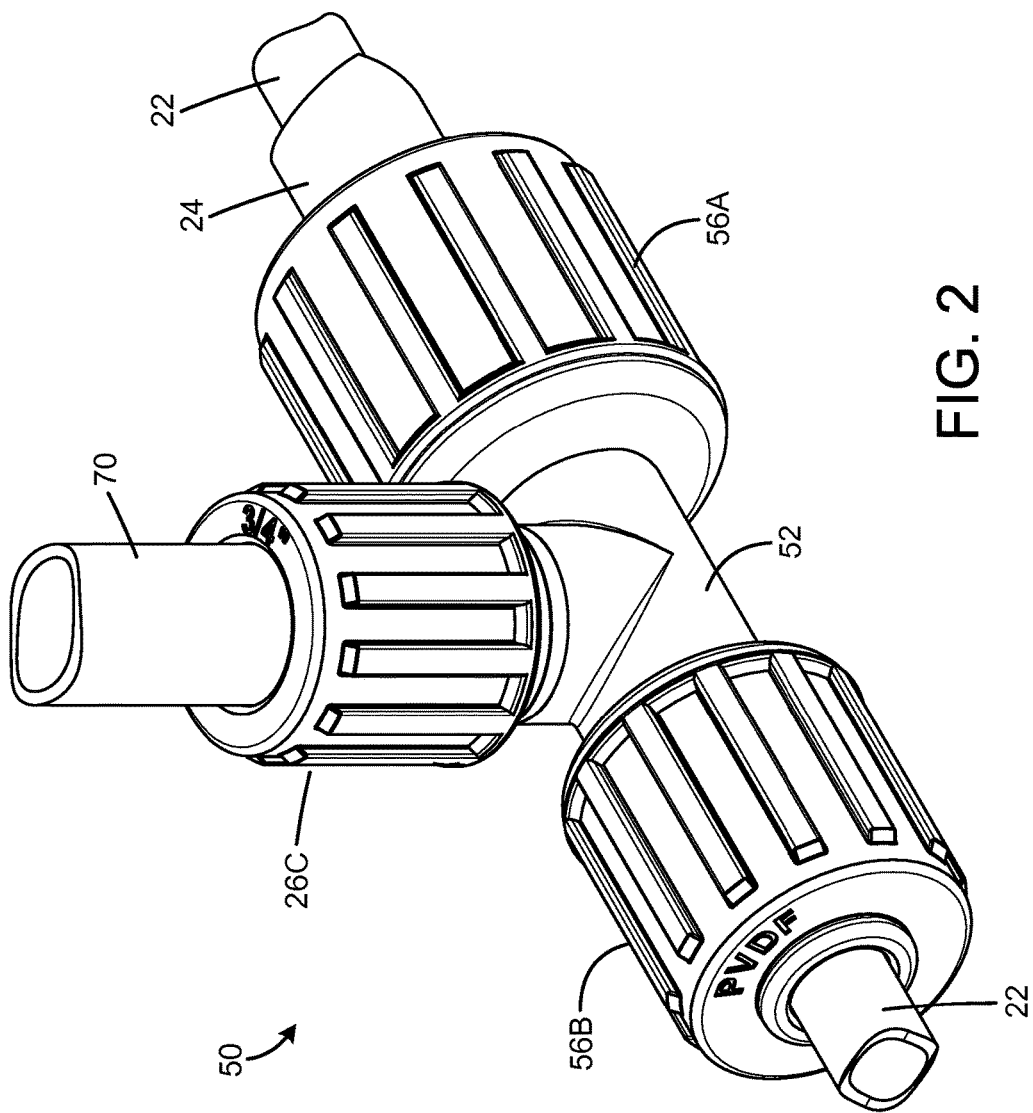
FIG. 2 is an isometric view of an exemplary embodiment of a non-terminating double containment fitting.

In the following detailed description and in the several figures of the drawing, like elements are identified with like reference numerals. The figures may not be to scale, and relative feature sizes may be exaggerated for illustrative purposes.

An exemplary operating environment 10 for a non-terminating double containment fitting is illustrated in FIG. 1. A tool 12 uses a fluid, e.g. a liquid chemical in performing some process task at a point of use. The point of use may include, for example, a tool used in semiconductor fabrication or pharmaceutical manufacture. A container 14 holds a supply of the fluid in its reservoir 16. The fluid is typically a hazardous material. Examples of the hazardous materials include caustic fluids, such as nitric acid, hydrochloric acid, sulfuric acid, hydroxides, ammonia and other chemical formulations. The container 14 is connected to the point of use 12 by a double containment tubing system 20, which includes a primary process tube 22 and an outer, secondary tube 24. The tubes may be of various diameters, depending on the application. For example, tube sizes of ¼-½ inch, ⅜-¾ inch, ½-¾ inch, ½-1 inch, ¾-1 inch, and 1-1¼ inch, are outer diameter pair sizes for the primary process line or tube and the secondary containment line or tube. Other sizes may be used, depending on the application.

In an exemplary operating environment, the primary and secondary lines may be flexible tubing, for example, tubing fabricated of PerFluoroAlkoxy (PFA) and TetraFluorEthylene-Perfluorpropylene (FEP).

A pump 18 is typically mounted in the container 14 to pump the fluid from the container 14 through the tubing system 20 to the point of use 12. The double containment system 20 addresses the possible situation in which the fluid leaks from the primary tube 22, with the outer tube containing the leaking fluid and preventing the fluid from leaking outside the system 20.

The system 20 is connected to the point of use 12 by a terminating double containment fitting 30 or a non-terminating fitting 100. A terminating double containment fitting is a fitting which passes the primary tube through to an operating fitting or port at the point of use, while terminating or closing the space between the primary and secondary tubes. Thus, in the event of a leak, the fluid contained in the annular space between the primary and secondary tubes does not pass through the fitting 30. In the alternative, the fitting may be a non-terminating fitting 100, which passes both the primary and secondary tubes through the fitting. An exemplary embodiment of fitting 100 is described below with respect to FIGS. 6-8.

In this exemplary embodiment, the system 20 is connected to the container 14 by a non-terminating double containment fitting 100. The fitting may be supported by a wall or bulkhead of the container 14. The system 20 is passed through the fitting 100 to the interior of the container, to a bypass non-terminating fitting 50, and the primary tubing 22 is connected to the pump 18. In other applications, the fitting 50 within the container 14 may be eliminated. A fitting 50 may also optionally be employed at the point of use 12, as diagrammatically illustrated in FIG. 1, in phantom.

Figure 3:
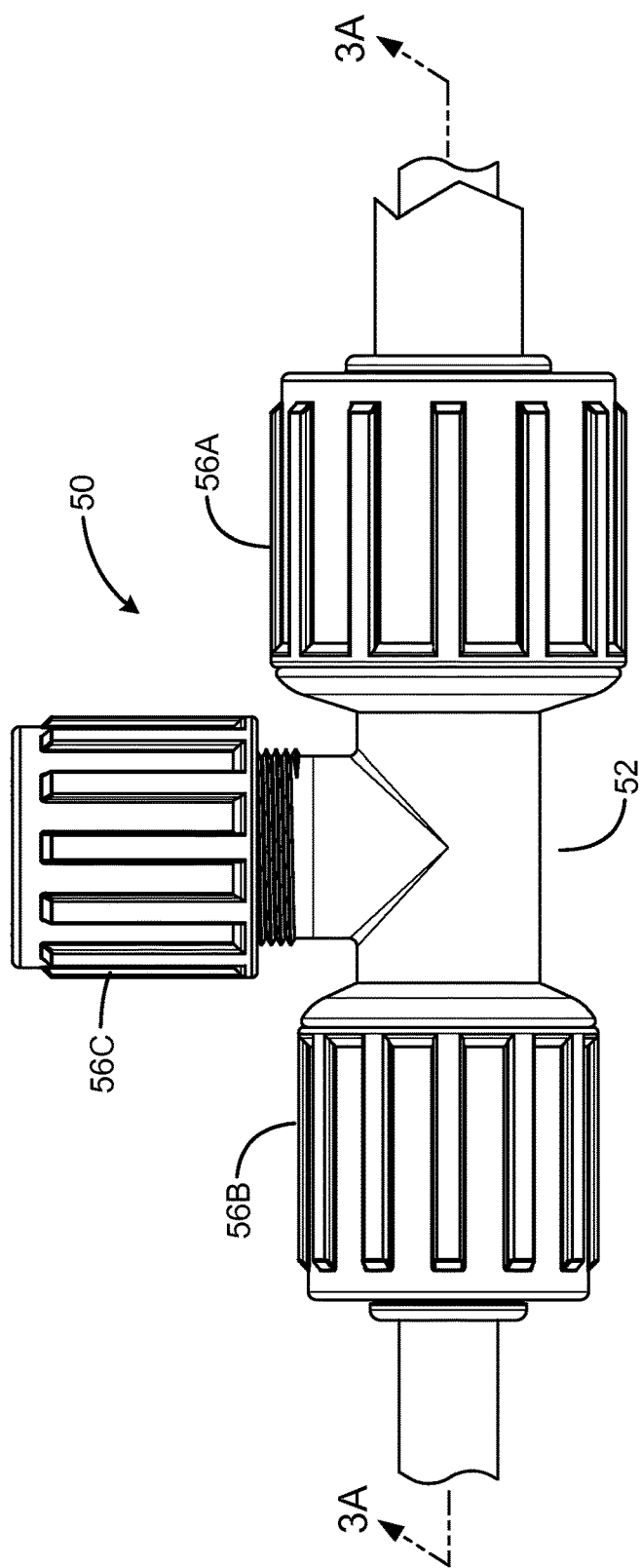
FIG. 3 is a front view of the exemplary fitting of FIG. 2.
Figure 3A:
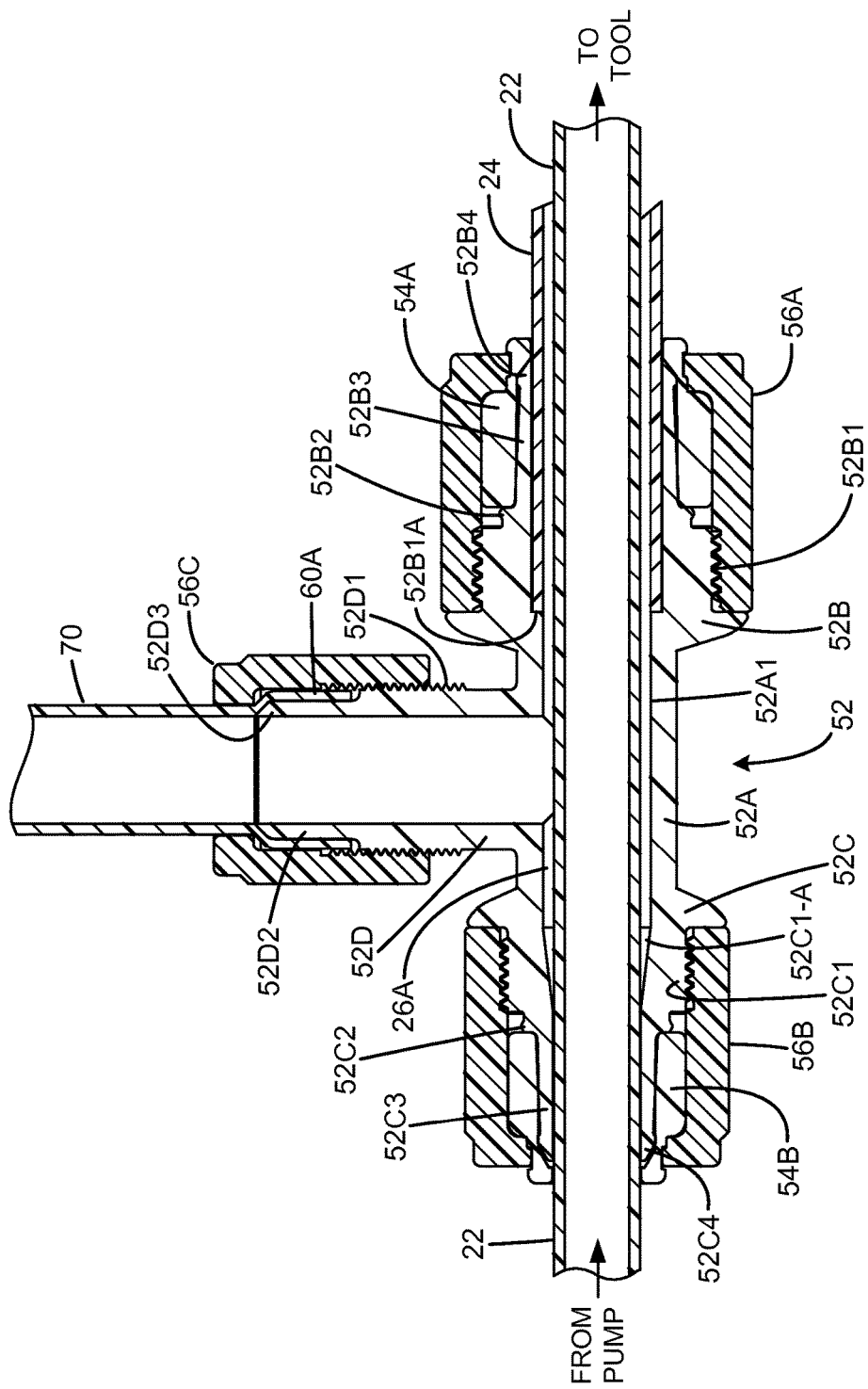
FIG. 3A is a cross-sectional view taken along line 3A-3A of FIG. 3.
Figure 4:
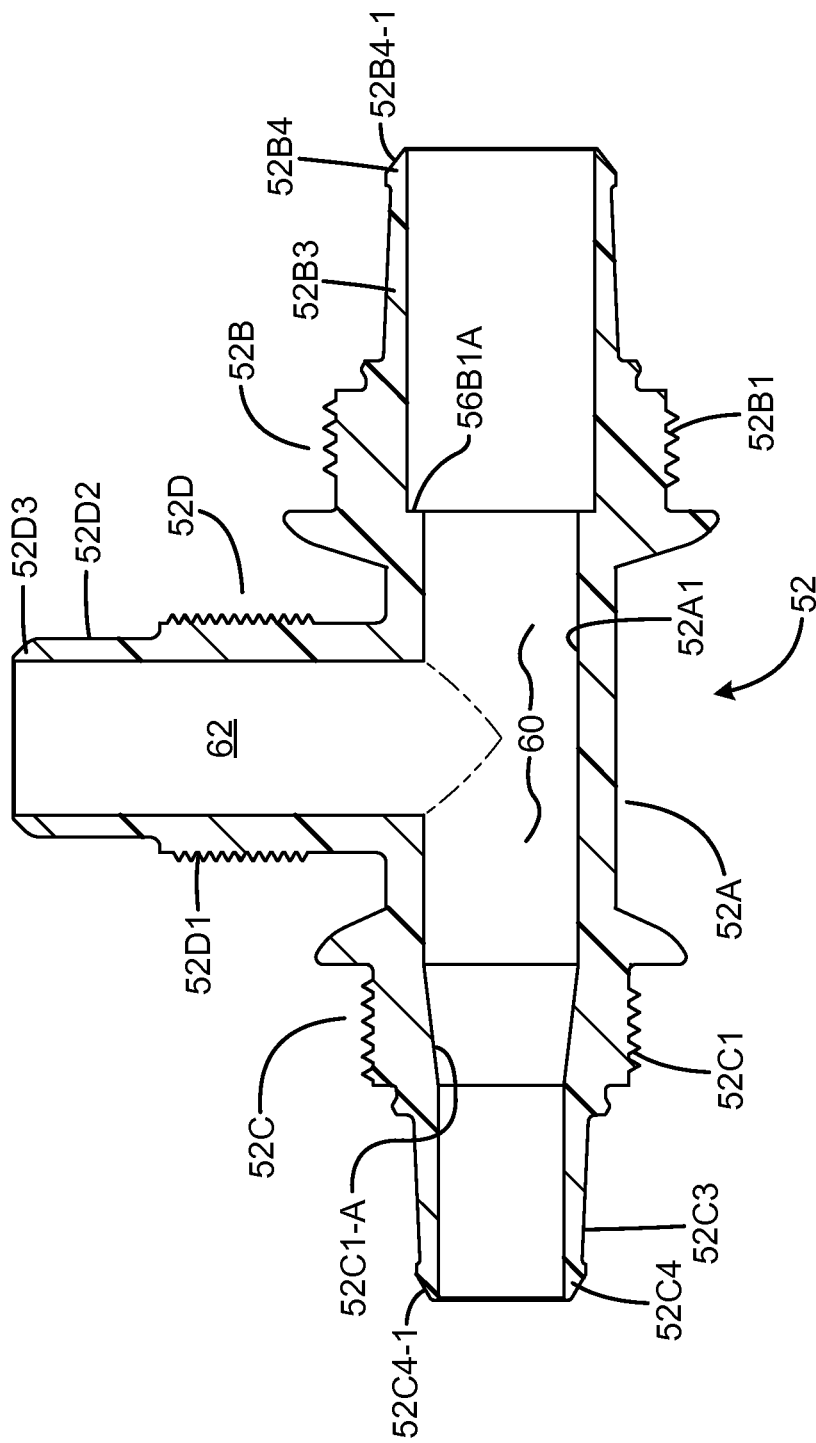
FIG. 4 is a cross-sectional view of the unitary body structure of the fitting of FIG. 2.

The fitting 50 provides a liquid path for liquid leaked from the primary tube 22 and captured within the annular space between the primary and secondary tubes 22, 24 to be passed out of the system 20, e.g. back to the container reservoir 14 or to another container or disposition. An exemplary embodiment of the fitting 50 is illustrated in FIGS. 2, 3, 3A, 4, 5, 5A and 5B. The fitting 50 is a generally T-shaped assembly. A fitting body 52 is formed as a unitary one-piece structure, typically by injection-molding, fabricated from PFA in this exemplary embodiment. The body 52 defines a central passageway 60 and a bypass passageway 62 perpendicular to the central passageway (FIG. 4). The body 52 has a center portion 52A, disposed between opposed first and second body ports 52B and 52C. The tubing system 20 from the tool enters the fitting through port 52B, and the primary tubing 22 is passed through the fitting and out the port 52C. The secondary tubing 24 is terminated in the first body port 52B at shoulder surface 56B1A (FIGS. 3A, 4). As described more fully below, in this exemplary embodiment, a connection system is provided for each of the first and second ports to secure the outer tubing 24 at the fitting port 52B.

The first body port 52B includes a threaded portion 52B1, which is engaged by a nut 56A. The port 52B further includes a shoulder portion 52B2 and a tapered portion 52B3, which terminates at a distal end 52B4, having a beveled tip surface 52B4-1 (FIG. 4). A separate sleeve structure 54A is fitted within the nut 56A. The sleeve 54A has a solid configuration, and is free of longitudinal slots. The sleeve 54A has an inner diameter at its interior end which is slightly larger than the outer diameter of the tip 52B4 of the tapered portion 52B3, but which is slightly smaller than the outer diameter of the tapered portion 52B3 adjacent the shoulder portion 52B2. The nut 56A is fabricated from Polyvinylidene Fluoride (PVDF), and the sleeve 54A is fabricated from PFA, in this example. The opening diameter of the tapered portion 52B3 is selected to be slightly larger than the outer diameter of the secondary tubing 24, so that the tubing system 20 can be inserted through the tapered portion and into the body 52, with the nut 56A and sleeve 54A in an unthreaded, untightened position relative to the fitting body. The end of secondary tubing 24 is positioned against the stop shoulder 52B1A of the first body port, i. e. terminated against, shoulder 52B1A.

Figure 5:
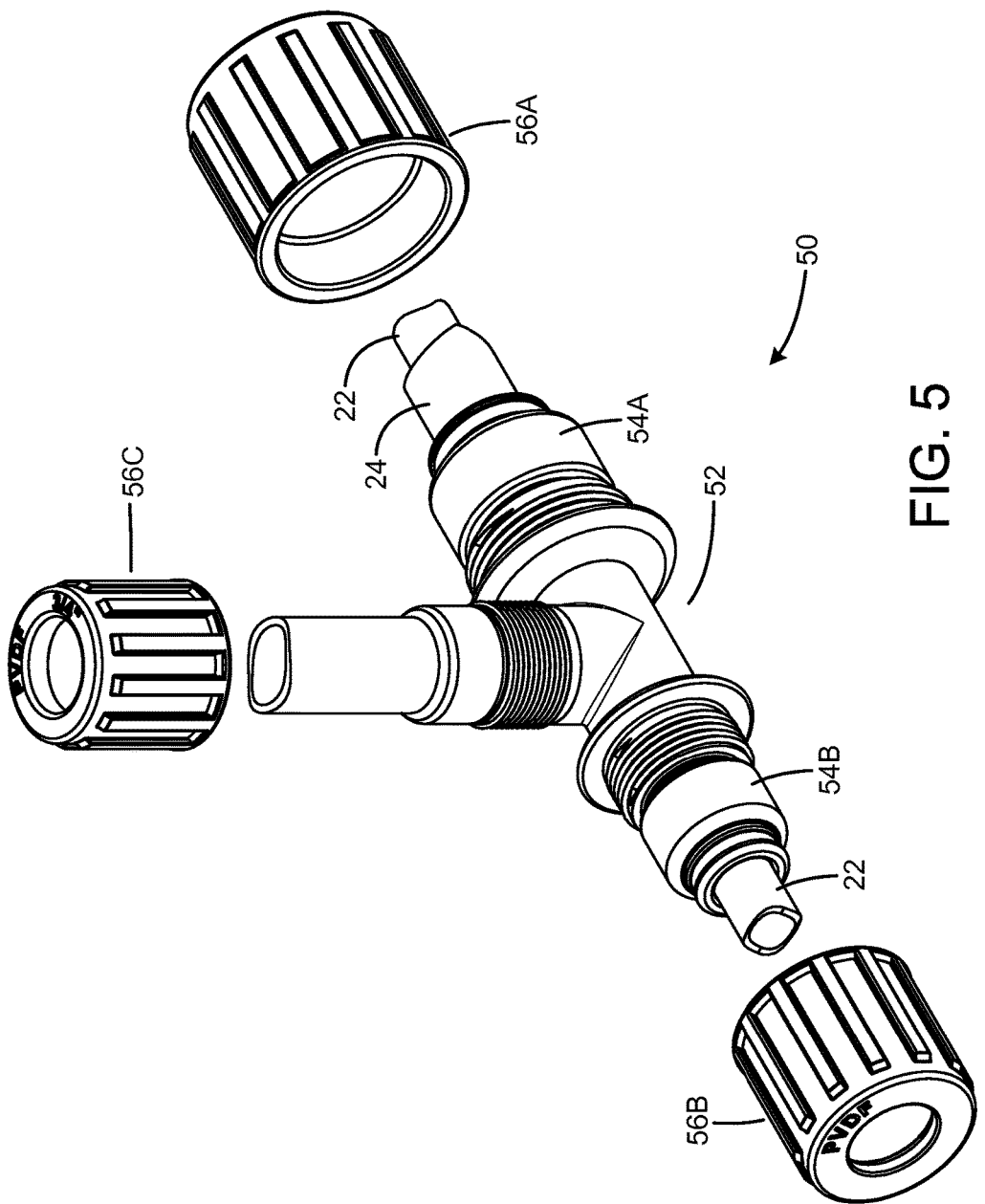
FIG. 5 is an exploded view of the exemplary fitting of FIG. 2.
Figure 5B:
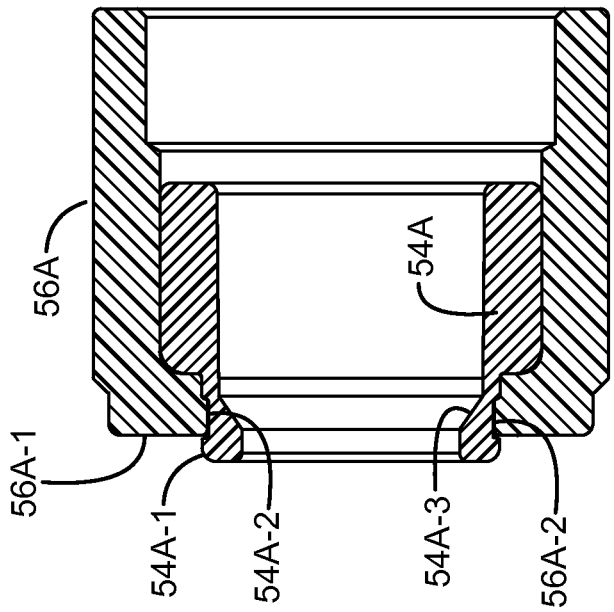
FIG. 5B is a cross-sectional view of the nut and sleeve assembled together.
Figure 5A:
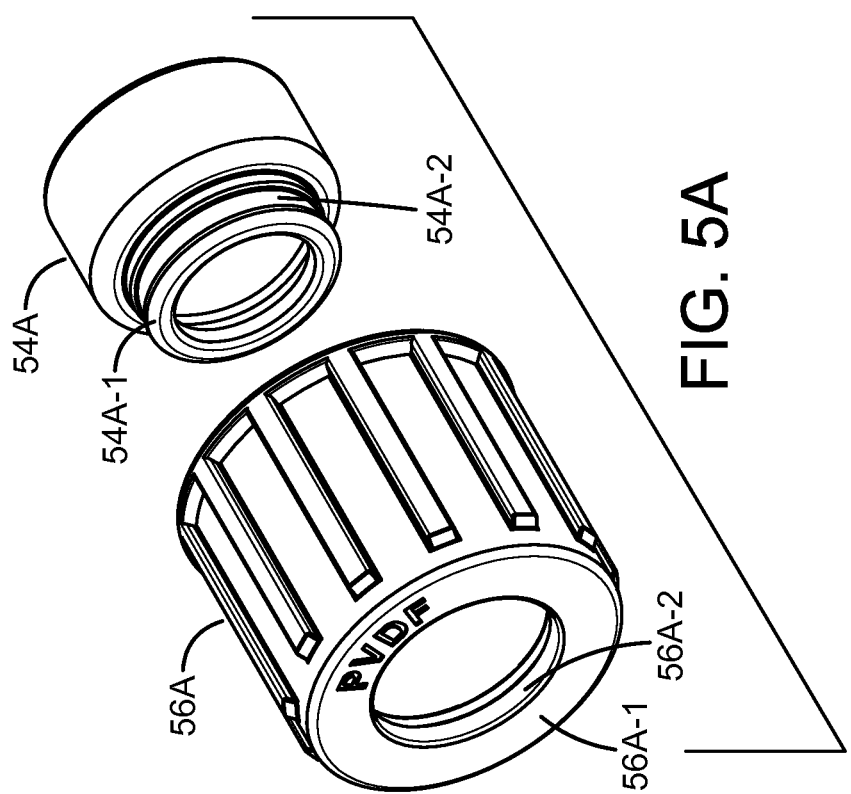
FIG. 5A is an exploded view of a nut and sleeve of the fitting of FIG. 2.

FIGS. 5A and 5B illustrate an exemplary nut and sleeve, nut 56A and sleeve 54A. The sleeve and nut are each of a unitary, one-piece construction in this exemplary embodiment. The sleeve is structured for an interference fit into the nut, as illustrated in FIG. 5B. The outer diameter of the end 54A-1 of the sleeve is slightly larger than the inner diameter of the nut opening at the nut end 56A-1, and the rounded edge of the end 54A-1 facilitates the press fit of the sleeve into engagement with the nut. The sleeve is formed with a groove 54A-2 in which inner lip portion 56A-2 is seated in the engaged position. Typically, the sleeve may be assembled to the nut at the factory, to the assembled condition illustrated in FIG. 5B. The sleeve 54A is fabricated of a softer, more flexible material (such as PFA) than that of the nut (which may be PVDF), facilitating the assembly of the sleeve into the nut.

The nut 56A is tightened on the threaded portion 52B1 of the fitting body 52, to the position illustrated in FIG. 3A, drawing the sleeve 54A along the outer surface of the tapered portion 52B3 until stopped against shoulder portion 52B2, and compressing the tapered portion 52B3 into contact with the outer surface of the secondary tubing 24. The sleeve 54A has an internal angled shoulder surface which stops against the corresponding beveled tip surface (surface 52B4-1, FIG. 4). In one exemplary embodiment, the outer diameter (OD) of the primary tubing 22 is 0.50 inch, the inner diameter (ID) of the tubing 22 is 0.38 inch, with corresponding dimensions of the secondary tubing 24 as 0.75 inch OD and 0.63 inch ID. This provides a difference of 0.13 inch between the OD and ID of the primary and second tubings 22, 24.

The threaded portion 52B1, tapered portion 52B3, sleeve 54A and nut 56A cooperate to form an annular mechanical smear seal or smear connection of the fitting body 52 to the secondary tubing 24 at the first port 52B, in the annular region underlying the tapered portion 52B3 of the fitting body. The smear seal mechanically secures the outer tubing 24 in place within the fitting body, to prevent the tubing from being pulled out of the fitting or pushed through the fitting, while the nut is in place. In an exemplary embodiment, the smear seal extends along a substantial length of the tapered portion, e.g. on the order of ½ inch to ¾ inch in an exemplary embodiment, and results from three to four revolutions of the nut on the threaded portion 52B1 of the fitting body. As used herein, a smear seal or smear connection occurs when similar materials are under a compression force from a harder, more rigid material. In this example, the nut 56A is formed of a harder, more rigid material than that of the sleeve 54A, the fitting body 52 and the outer tubing 24. As the nut is threaded onto the fitting body, the sleeve compresses the tapered portion 52B3, in turn compressing the fitting body onto the outer tubing 24, resulting in a smear seal between the tubing and the fitting body. The smear seal contrasts with a conventional compression seal, which typically results in a compression at an annular bead, with a relatively short longitudinal seal length. The conventional compression seal also tends to deform the sealed components, typically permanently, at the seal junction. In contrast, with the smear seal or seal connection, in an exemplary embodiment, the nut 56A and sleeve 54A can be removed from the fitting body, to permit disassembly of the fitting from the tubing system 20, without permanently deforming the tubing 24.

The primary tubing 22 is passed through the fitting 50, extending from the second body port 52C, and in this exemplary embodiment, is connected to a pump in the supply container 14. The second body port 52C includes a threaded portion 52C1, which is engaged by a nut 56B. The port 52C further includes a shoulder portion 52C2, and tapered portion 52C3, which terminates at a distal end 52C4. A separate sleeve 54B is fitted within the nut 56B. The nut 56B is fabricated of PVDF, and the sleeve 54B from PFA, in this example. The sleeve 54B, nut 56B and the tapered portion 52C3 of the fitting body 52 cooperate in the same manner as described above regarding the first port. The opening diameter of the tapered portion 52C3 is selected to be slightly larger than the outer diameter of the primary tubing 22, so that the tubing 22 can be inserted through the tapered portion and out the body 52. The nut 56B is tightened on the threaded portion 52C1, to the position illustrated in FIG. 3A, drawing the sleeve 54B along the outer surface of the tapered portion until stopped at shoulder portion 52C2, and compressing the tapered portion into sealing contact with the outer surface of the primary tubing 22. The threaded portion 52C1, tapered portion 52C3, sleeve 54B and nut 56B cooperate to form a mechanical smear seal or smear connection between the tapered portion 52C3 of the fitting body and the primary tubing 22 at the second port 52B. The nut 56B with sleeve 54B can be removed, to permit disassembly of the fitting from the tubing system 20.

The tubing system 20 provides an annular space 26 between the primary tubing 22 and the outer, secondary tubing 24. Even though the secondary tubing 24 is terminated at shoulder 52B2, the fitting 50 maintains an annular space 26A (FIG. 3A) through the center fitting portion 52A between the primary tubing 22 and the cylindrical surface 52A1 of the portion 52. Thus, any fluid leaking from the primary tubing 22 in the system 20 may flow into the annular space 26A. The threaded portion 52C1 of the second port 52C includes an internal tapered surface 52C1-A which at its junction with the tapered portion 52C4 closes the annular space 26A. Thus, any fluid in the annular space 26A cannot escape through the port 52C.

In this embodiment of a non-terminating fitting 50, a bypass port 52D is provided, which is in fluid communication with the annular space 26A, and allows fluid in the annular space to flow out through the port 52D. The bypass port includes a threaded portion 52D1, which is engaged by a nut 56C. The port 52D further includes a tube engaging portion 52D2, which terminates at a beveled distal end 52D3. A bypass passageway 62 is defined through the port 52D, in communication with the annular spaced 26A when the tubing 22 is in place within the fitting 50. The nut 56C is fabricated of PVDF, in this example. A flared end 60A of an overflow tube 60 is fitted over the tube engaging portion 52D2. The nut 56C is tightened on the threaded portion 52D1, to the position illustrated in FIG. 3A, compressing the flared end portion 60A between the tube engaging portion 52D3 and the nut, to provide a leak proof seal.

The overflow tubing 60 may be connected to the reservoir 16 to replenish the volume of source fluid. Alternatively, the overflow tubing may be connected to a separate overflow container, or to another destination.

Figure 6:
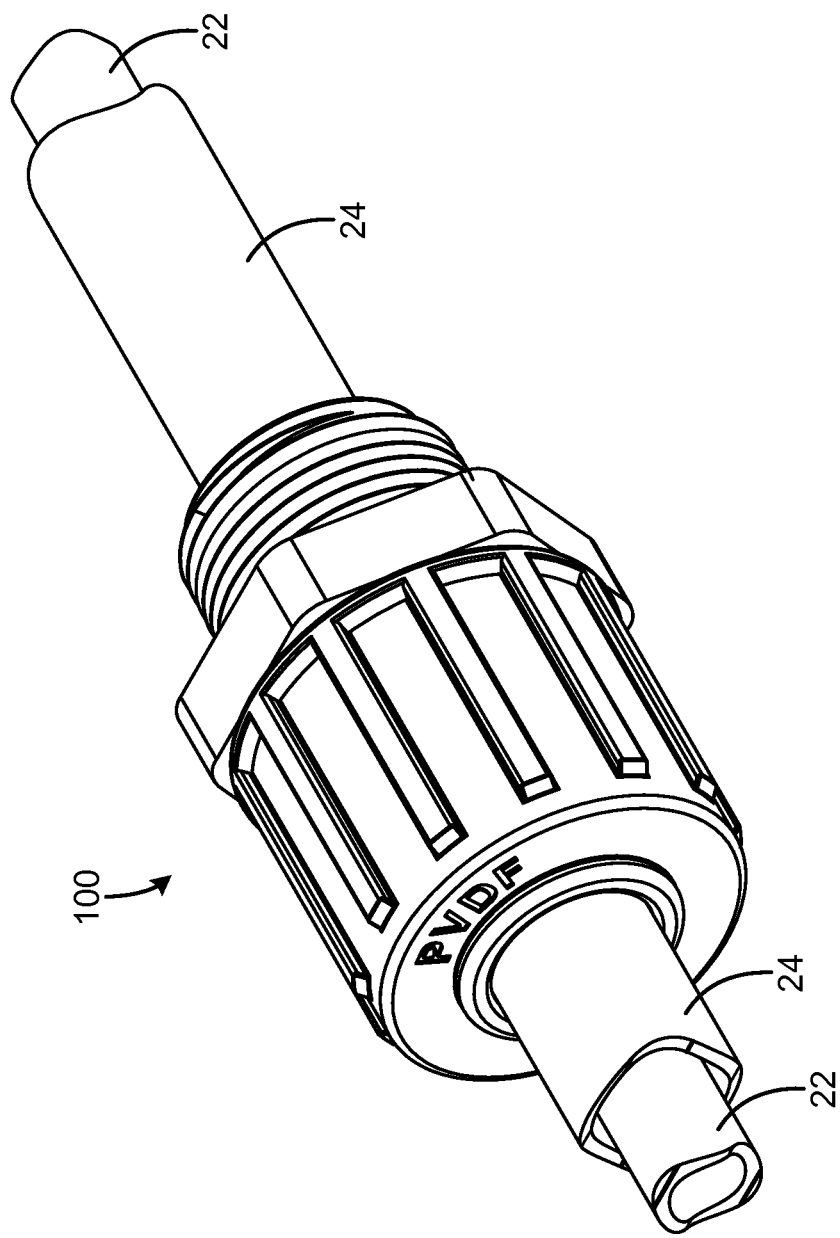
FIG. 6 is an isometric view of an alternate embodiment of a non-terminating double containment fitting.
Figure 7:
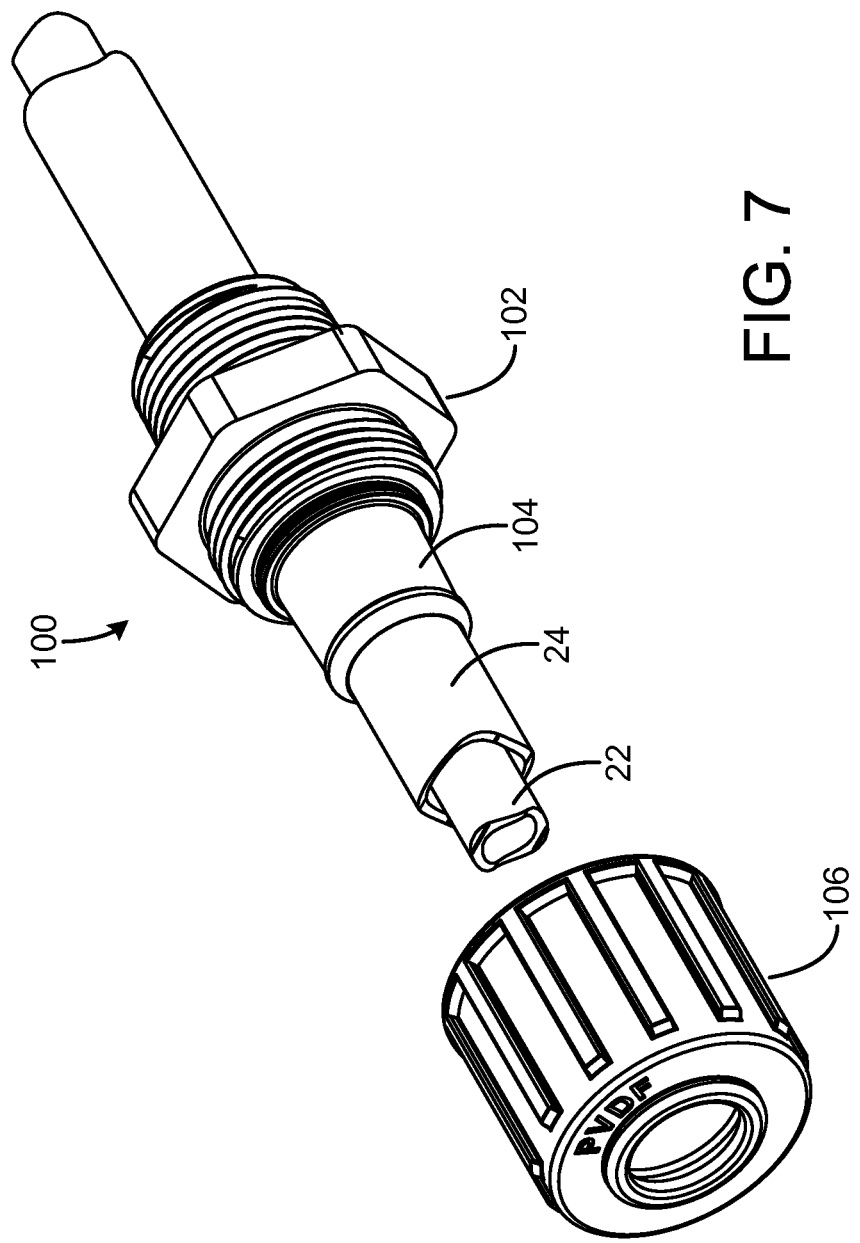
FIG. 7 is an isometric view of the fitting of FIG. 6 with the nut disengaged.
Figure 7A:
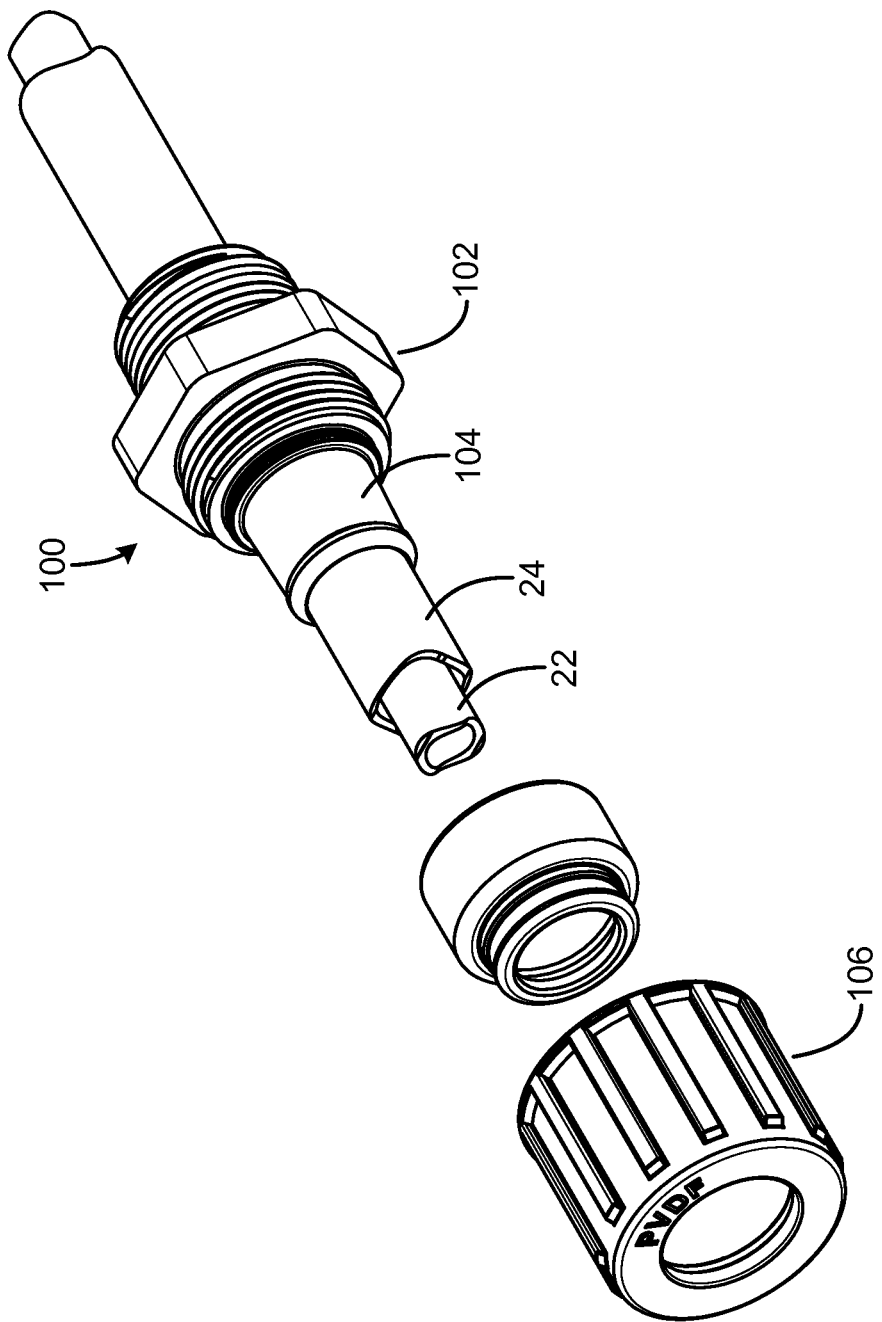
FIG. 7A is an isometric view of the fitting of FIG. 6 with the nut and sleeve in exploded view.
Figure 8:
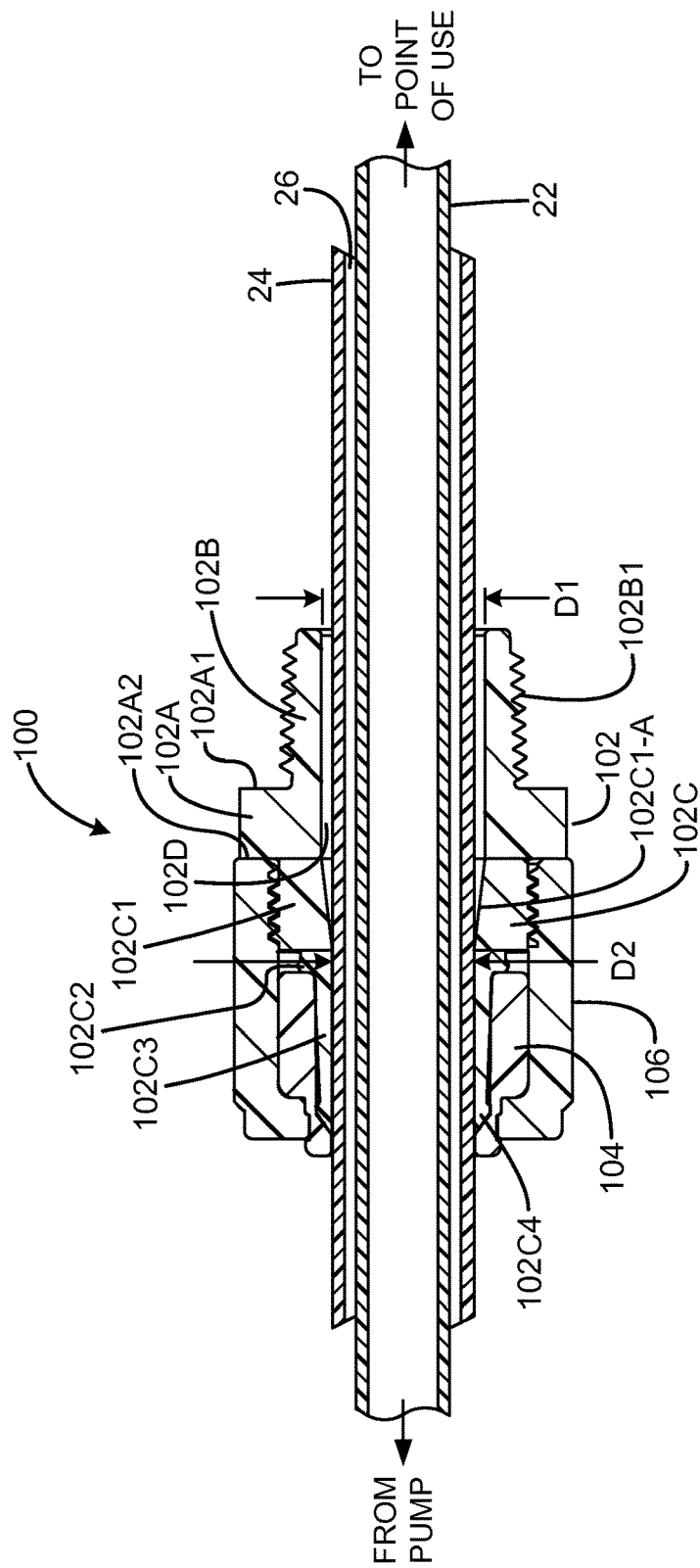
FIG. 8 is a cross-sectional view of the fitting of FIG. 6.

An alternate embodiment of a non-terminating double containment fitting 100 is illustrated in FIGS. 6-8. In this embodiment, both the primary tubing 22 and the secondary tubing 24 are passed through the fitting. The secondary fitting may terminate between the fitting and the pump, for example. This fitting can be used in applications in which the leaked fluid in the annular space 26 can drain back into the supply container 14, for example, by cutting or ending the secondary tubing 24 upstream of the pump. In this embodiment, the fitting 100 includes a fitting body structure 102 having an opening 102D defined through the body, a threaded nut 104 and sleeve 104. Alternatively, a fitting 50 can be used with the fitting 100, e.g. at the point of use as illustrated in phantom in FIG. 1.

A center portion 102A of the body structure defines a flange. A first threaded end body portion 102B extends from one side 102A1 of the flange or center portion, and is configured to receive the double containment system 20 from the tool.

The body portion 102 further defines a second threaded end body portion 102C extending from an opposite side 102A2 of the flange portion. The body portion 102C includes an externally threaded portion 102C1, configured for engagement with the internal threads of the nut 104. The body portion 102C further includes a shoulder portion 102C2 and a tapered portion 102C3 with tip 102C4, extending away from the flange portion 102C1.

The opening 102D in the body structure 102 has a first diameter D1 in the first threaded end portion 102B and in the center, flange portion 102A, which is larger (by 0.13 inch in an exemplary embodiment with the foregoing exemplary dimensions of the primary and secondary tubings) than the outer dimension of the secondary tubing 24, so that the secondary tubing, with primary tubing 22, can be easily fitted into the first end portion. The surface 102C1-A of the center opening 102D tapers down to a reduced opening diameter D2 within portion 102C1 of the second portion 102C. Diameter D2 is just slightly larger than the outer diameter of secondary tubing 24, so that the tubing 24 can be fitted through the end portion 102C. Exemplary dimensions for D1, D2 are 0.88 inch and 0.76 inch, respectively, for the example of the secondary tubing OD of 0.75 inch.

The sleeve 104, nut 106 and the tapered portion 102C3 with tip 102C4 are cooperatively dimensioned so that, as the nut 106 is tightened on the threaded portion 102C1, to the position illustrated in FIG. 8, drawing the sleeve 104 along the outer surface of the tapered portion until stopped at shoulder portion 102C2, and compressing the tapered portion into frictional contact with the outer surface of the primary tubing 22, forming a mechanical smear seal, or smear connection, in the same manner as described above with respect to nut 56A, sleeve 54A, tapered portion 52B3 and tubing 24. The nut 106 with sleeve 104 can be removed from the fitting body 102 to allow the tubing system to be withdrawn from the fitting, or repositioned along its longitudinal length The fitting 100 may be secured in a bulkhead opening, with a nut (not shown in FIG. 8) threaded onto the threaded portion 102B1 to sandwich the bulkhead between the flange surface 102A1 and the nut.

Although the foregoing has been a description and illustration of specific embodiments of the subject matter, various modifications and changes thereto can be made by persons skilled in the art without departing from the scope and spirit of the invention.

What is claimed is:

1. A double containment fitting for connection to a double containment tubing system with an outer, secondary containment tubing surrounding an inner, primary tubing, with an annular space between the inner and outer tubing, the fitting comprising:

a fitting body defining a central passageway, the fitting body having a center portion disposed between opposed first and second body ports;

the fitting body configured to receive the tubing system within the first body port;

the central passageway having a first diameter in the first port selected to allow the secondary tubing into the first body port;

a connection system for mechanically securing the secondary tubing to the first body port, the system comprising:

a first external threaded surface on a first portion of the first body port;

a tapered portion of the first body portion extending from the first portion and surrounding the central passageway, the tapered portion having a first thickness which tapers from a first thickness adjacent the first external threaded surface to a reduced thickness adjacent a tip of the first port;

a threaded nut having internal threads and configured to engage the external threaded surface on the first body port;

a sleeve configured to fit within the threaded nut and over the tapered portion, and to apply a compression force on the tapered portion of the first body port as the nut is threaded onto the external threaded surface to compress the tapered portion onto an outer surface of the secondary tubing to form an annular mechanical smear seal connection between an internal surface of the tapered portion and the outer surface of the outer, secondary tubing to fix the outer, secondary tubing in place within the fitting body; and wherein the nut is made of a material which is harder than the material or materials from which the sleeve, the fitting body and the tubing are fabricated.

2. The fitting of claim 1, wherein the fitting body is a unitary one-piece structure fabricated from a plastic material.

3. The fitting of claim 1, wherein the secondary tubing terminates within the fitting body in said central passageway.

4. The fitting of claim 3, wherein the fitting body includes a stop shoulder for registering a position of an end of the secondary tubing.

5. The fitting of claim 1, wherein the nut is a unitary one-piece structure fabricated from a plastic material, and the sleeve is a unitary structure fabricated from a different plastic material than the nut.

6. The fitting of claim 5, wherein the nut is fabricated from Polyvinylidene Fluoride (PVDF), and the sleeve and the fitting body are fabricated from PerFluoroAlkoxy (PFA) or TetraFluorEthylene-Perfluorpropylene (FEP).

7. The fitting of claim 1 wherein the connection system is configured to free the secondary tubing from engagement with the fitting body by disengagement of the nut from the fitting body.

8. A double containment fitting for connection to a double containment tubing system with an outer, secondary containment tubing surrounding an inner, primary tubing, with an annular space between the inner and outer tubing, the fitting comprising:
 a fitting body defining a central passageway, the fitting body having a center portion disposed between opposed first and second body ports;
 the fitting body configured to receive the tubing system within the first body port;
 the central passageway having a first diameter in the first port selected to allow the secondary tubing into the first body port;
 a connection system for mechanically securing the secondary tubing to the first body port, the system comprising:
 a first external threaded surface on a first portion of the first body port;
 a tapered portion of the first body portion extending from the first portion and surrounding the central passageway, the tapered portion having a first thickness which tapers from a first thickness adjacent the first external threaded surface to a reduced thickness adjacent a tip of the first port;
 a threaded nut having internal threads and configured to engage the external threaded surface on the first body port;
 a sleeve configured to fit within the threaded nut and over the tapered portion, and to apply a compression force on the tapered portion of the first body port as the nut is threaded onto the external threaded surface to compress the tapered portion onto the secondary tubing to form a mechanical connection between an internal surface of the tapered portion and the outer, secondary tubing of the tubing system to fix the outer tubing in place within the fitting body;
 wherein the nut is made of a material which is harder than the material or materials from which the sleeve, the fitting body and the tubing are fabricated; and
 wherein the fitting body further defines a bypass passageway transverse to the central passageway, the fitting body having a bypass body port through which the bypass passageway extends, the bypass passageway configured in fluid communication with the annular space between the primary and secondary tubing within the fitting body, wherein fluid in the annular space is conducted to the bypass body port.

9. A double containment fitting for connection to a double containment tubing system with an outer, secondary containment tubing surrounding an inner, primary tubing, with an annular space between the inner and outer tubing, the fitting comprising:
 a fitting body defining a central passageway, the fitting body having a center portion disposed between opposed first and second body ports;
 the fitting body configured to receive the tubing system within the first body port;
 the central passageway having a first diameter in the first port selected to allow the secondary tubing into the first body port;
 a connection system for mechanically securing the secondary tubing to the first body port, the system comprising:
 a first external threaded surface on a first portion of the first body port;
 a tapered portion of the first body portion extending from the first portion and surrounding the central passageway, the tapered portion having a first thickness which tapers from a first thickness adjacent the first external threaded surface to a reduced thickness adjacent a tip of the first port;
 a threaded nut having internal threads and configured to engage the external threaded surface on the first body port;
 a sleeve configured to fit within the threaded nut and over the tapered portion, and to apply a compression force on the tapered portion of the first body port as the nut is threaded onto the external threaded surface to compress the tapered portion onto the secondary tubing to form a mechanical connection between an internal surface of the tapered portion and the outer, secondary tubing of the tubing system to fix the outer tubing in place within the fitting body;
 wherein the nut is made of a material which is harder than the material or materials from which the sleeve, the fitting body and the tubing are fabricated; and
 wherein the sleeve has an angled internal surface, and said first port has a beveled tip, and wherein the angled internal surface of the sleeve is configured to contact the beveled tip of the first port as the nut is threaded onto the external threaded surface of the first port.

10. A double containment fitting for connection to a double containment tubing system with an outer, secondary containment tubing surrounding an inner, primary tubing, with an annular space between the inner and outer tubing the fitting comprising:
 a fitting body defining a central passageway and a bypass passageway transverse to the central passageway, the fitting body having a center portion disposed between opposed first and second body ports and a bypass body port through which the bypass passageway extends;
 the fitting body configured to receive the tubing system into the first body port, and to pass the primary tubing through the central passageway and out the second body port;
 the central passageway having a first diameter in the first port selected to allow the secondary tubing into the first body port, the central passageway having a second diameter in the second port and selected to be allow the primary tubing to pass through the second port, the first diameter larger than the second diameter;
 the bypass passageway configured in fluid communication with the annular space between the primary and secondary tubing within the fitting body, wherein fluid in the annular space is conducted to the bypass body port;
 a first connection system for mechanically securing the secondary tubing to the first body port, and a second connection system for mechanically sealing the primary tubing to the second body port;
 wherein the first connection system comprises:
 a first external threaded surface on a first portion of the first body port;
 a first tapered portion of the first body port extending from the first portion and surrounding the central passageway;
 a first threaded nut having internal threads and configured to engage the first external threaded surface on the first body port;

a first sleeve configured to fit over the first tapered portion and within the first threaded nut, and to apply a compression force on the first tapered portion of the first body port to compress the tapered portion onto the secondary tubing as the first threaded nut is threaded onto the first external threaded surface.

11. The fitting of claim 10, wherein the second connection system comprises:
   a second external threaded surface on a first portion of the second body port;
   a second tapered portion of the second body port extending from the first portion of the second body port and surrounding the central passageway;
   a second threaded nut having internal threads and configured to engage the second external threaded surface on the second body port;
   a second sleeve configured to fit over the second tapered portion and within the second threaded nut, and to apply a compression force on the second tapered portion of the second body port as the second nut is threaded onto the second external threaded surface to compress the second tapered portion onto the primary tubing.

12. The fitting of claim 10, wherein the secondary tubing terminates within the fitting body in said central passageway.

13. The fitting of claim 12, wherein the fitting body includes a stop shoulder for registering a position of an end of the secondary tubing.

14. The fitting of claim 10, wherein the fitting body is a unitary one-piece structure fabricated from a plastic material.

15. The fitting of claim 10, wherein the bypass port includes a bypass port external threaded portion, the fitting further comprising a bypass port threaded nut configured to engage the bypass port and to secure a bypass tubing in place on the bypass port.

* * * * *